United States Patent
Nakao et al.

(10) Patent No.: US 7,652,653 B2
(45) Date of Patent: Jan. 26, 2010

(54) DISPLAY DEVICE

(75) Inventors: Takayuki Nakao, Atsugi (JP); Hideo Sato, Hitachi (JP); Masahiro Maki, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 527 days.

(21) Appl. No.: 11/522,932

(22) Filed: Sep. 19, 2006

(65) Prior Publication Data

US 2007/0080922 A1   Apr. 12, 2007

(30) Foreign Application Priority Data

Sep. 28, 2005   (JP)   ............................... 2005-281040

(51) Int. Cl.
   *G09G 3/36*   (2006.01)
(52) U.S. Cl. ......................................... 345/100; 377/64
(58) Field of Classification Search ............. 345/55–73, 345/92–93, 100, 206–699; 349/62; 377/64, 377/68, 69, 70, 73, 74
   See application file for complete search history.

(56) References Cited

U.S. PATENT DOCUMENTS 4,420,700 A  *  12/1983  Fay et al. ..................... 327/434
6,801,194 B2 *  10/2004  Miyazawa et al. .......... 345/204
2006/0227093 A1*  10/2006  Jang et al. .................... 345/100

FOREIGN PATENT DOCUMENTS

| JP | 10-199284 | 12/1996 |
| JP | 2000-227784 | 6/1999 |
| JP | 2002-215118 | 9/2001 |

* cited by examiner

*Primary Examiner*—Alexander Eisen
*Assistant Examiner*—Patrick Marinelli
(74) *Attorney, Agent, or Firm*—Stites & Harbison PLLC; Juan Carlos A. Marquez, Esq.

(57) ABSTRACT

The present invention relates to a display device, and more particularly to a display device which includes a drive circuit having a CMOS shift register which is constituted of a CMOS circuit. The display device includes: a plurality of pixels; and a drive circuit, wherein the drive circuit includes a shift register that includes n(n≧2) basic circuits connected vertically in multiple rows, the basic circuit includes a first transistor having a first electrode to which a clock is applied, and a second transistor of a second conductive type which is different from the first transistor of the first conductive type in a conductive type and has a second electrode thereof connected to a second electrode of the first transistor and has a second power source voltage applied to a first electrode thereof, an input signal is applied to a control electrode of the first transistor and a control electrode of the second transistor, and the second electrode of the first transistor is connected to a scanning circuit output terminal.

16 Claims, 10 Drawing Sheets

DISPLAY DEVICE

CROSS-REFERENCE TO RELATED APPLICATIONS

The disclosure of Japanese Patent Application No. P2005-281040 filed on Sep. 28, 2005 including the claims, the specification, the drawings and the abstract is incorporated herein by reference in its entirety.

BACKGROUND OF THE INVENTION

1. Field of the Invention

The present invention relates to a display device, and more particularly to a display device which includes a drive circuit having a CMOS shift register which is constituted of a CMOS circuit.

2. Description of the Related Art

In general, in an active matrix liquid crystal display device which uses thin film transistors (TFT: Thin Film Transistor) as active elements, for example, a shift register circuit is used for sequentially applying a selective scanning voltage to scanning lines.

As the shift register circuit, there have been known a CMOS shift register which is constituted of a CMOS (Complementary Metal Oxide Semiconductor) (see following Patent Document 1, Patent Document 2 below) and an nMOS single-channel shift register which is constituted of an nMOS single-channel transistor (see Patent Document 3 below).

FIG. 14 is a circuit diagram showing a unit circuit of a conventional CMOS shift register which is the circuit constitution described in the above-mentioned Patent Document 1 and Patent Document 2.

The unit circuit shown in FIG. 14 includes a clocked inverter (INV1) which inverts an input signal (IN), an inverter (INV2) which re-inverts an inverted signal of the input signal (IN), and a clocked inverter (INV3) which feedbacks a re-inverted signal of the input signal (IN) to an input of the inverter (INV2).

Then, an output of the inverter (INV2) becomes a transfer output (TRN). Further, the input signal (IN) and the transfer output (TR) are inputted to a NAND circuit (NAND). An output signal of the NAND circuit (NAND) is inverted by an inverter (INV4) thus generating a scanning circuit output (OT).

Here, the clocked inverter (INV1) in an odd-numbered-row unit circuit inverts the input signal when a clock (CLK) assumes a High level (inverting clock (CLKB) being at a Low level), and the clocked inverter (INV3) in unit circuit in the same row inverts the input signal when the clock (CLK) assumes a Low level ((inverting clock (CLKB) being at a High level).

On the other hand, in the clocked inverter (INV1, INV3) in an even-numbered-row unit circuit, the relationship with the clock signal which inverts the input signal is opposite to the relationship with the clock signal in the odd-numbered-row unit circuit.

Here, there have been known following related art which is relevant to the present invention.

Patent Document 1: JP-A-2000-227784
Patent Document 2: JP-A-10-199284
Patent Document 3: JP-A-2002-215118

SUMMARY OF THE INVENTION

Recently, the development of high definition is in progress in an active matrix liquid crystal display device which is used in a digital still camera, a mobile phone or the like.

Along with the development of high definition, as shown in FIG. 15, the CMOS shift register has a drawback that the number of transistor elements is increased thus giving rise to a drawback that the achievement of high definition is difficult. Here, FIG. 15 is a circuit diagram showing the actual circuit constitution of a unit circuit shown in FIG. 14.

Further, p-type MOS transistors (PM1, PM2) and n-type MOS transistors (NM1, NM2) shown in FIG. 15 are configured such that a gate is directly connected to a clock bus through which a clock (CLK) and an inverted clock (CLKB) are transmitted and hence, a load of the clock bus is increased thus giving rise to a drawback that the power consumption is increased.

Further, the p-type MOS transistors (PM1, PM2) and the n-type MOS transistors (NM1, NM2) shown in FIG. 15 are operated for every clock signal and hence, the transistor is remarkably deteriorated thus giving rise to a drawback with respect to the reliability thereof in a high speed operation.

Further, for example, although the nMOS single-channel shift register which is described in the previously-mentioned Patent Document 3 realizes the low input capacitance and the high reliability, the shift register has a drawback that the reduction of voltage and the high-speed driving are difficult.

The present invention has been made to overcome the above-mentioned drawbacks of the related art and it is an object of the present invention to provide a display device which includes a drive circuit having a CMOS shift register which is constituted of a simple CMOS circuit.

The above-mentioned and other objects of the present invention and novel features of the present invention will become apparent from the description of this specification and attached drawings.

To explain the summary of typical inventions among inventions disclosed in this specification, they are as follows.

(1) A display device which includes:
 a plurality of pixels; and
 a drive circuit which drives the plurality of pixels,
wherein
 the drive circuit includes a shift register,
 the shift register includes n (n≧2) pieces of basic circuits which are connected vertically in multiple rows,
 the basic circuit includes a first transistor of a first conductive type having a first-electrode to which a clock is applied, and a second transistor of a second conductive type which is different from the first transistor of the first conductive type in a conductive type and has a second electrode thereof connected to a second electrode of the first transistor and has a second power source voltage applied to a first electrode thereof,
 an input signal is applied to a control electrode of the first transistor and a control electrode of the second transistor, and
 the second electrode of the first transistor is connected to a scanning circuit output terminal.

(2) In the constitution (1), the basic circuit includes:
 a third transistor of the first conductive type in which a first power source voltage different from the second voltage source is applied to a first electrode thereof;
 a fourth transistor of the second conductive type which has a second electrode thereof connected to a second electrode of the third transistor, a control electrode thereof connected to the second electrode of the first transistor, and the second power source voltage applied to a first electrode thereof;

a fifth transistor of the first conductive type which has the first power source voltage applied to a first electrode thereof and has a second electrode thereof connected to a control electrode of the third transistor; and a sixth transistor of the second conductive type which has a second electrode thereof connected to the second electrode of the fifth transistor and has the second power source voltage applied to a first electrode thereof; wherein the input signal is applied to a control electrode of the fifth transistor, a reset signal is applied to a control electrode of the sixth transistor, and a second electrode of the third transistor is connected to a transfer output terminal.

(3) In the constitution (2), the basic circuit includes a capacitive element which has one end which is connected to the second electrode of the fifth transistor and another end to which a predetermined voltage is applied.

(4) In the constitution (3), the predetermined voltage is the first power source voltage or the second power source voltage.

(5) In anyone of the constitutions (1) to (4), the basic circuit includes a seventh transistor of the second conductive type which has a second electrode thereof connected to the control electrode of the second transistor, a control electrode thereof connected to the second electrode of the first transistor, and the second power source voltage applied to a first electrode thereof.

(6) In any one of the constitutions (1) to (5), the basic circuit includes a buffer circuit which is provided between the second electrode of the first transistor and the scanning circuit output terminal.

(7) In the constitution (6), the buffer circuit is constituted of an inverter which has even-numbered rows vertically connected to each other.

(8) In any one of the constitutions (2) to (4), the basic circuit includes an eighth transistor of the second conductive type which is connected to the sixth transistor in parallel, wherein an inverted signal of a start signal is applied to a control electrode of the eighth transistor.

(9) In anyone of the constitutions (1) to (8), the basic circuit includes a ninth transistor of the second conductive type which is connected to the first transistor in parallel, wherein an inverted signal of an input signal is applied to a control electrode of the ninth transistor.

(10) In the constitution (6) or (7), the basic circuit has a tenth transistor of the second conductive type which is connected to the first transistor in parallel, wherein a control electrode of the tenth transistor is connected to an output terminal of the buffer circuit.

(11) In any one of the constitutions (1) to (10), a first clock is supplied to the first electrodes of the first transistors of odd-numbered-row basic circuits out of the n-pieces of basic circuits, a second clock is supplied to the first electrodes of the first transistors of even-numbered-row basic circuits out of the n-pieces of basic circuits, and the first clock and the second clock are equal in cycle and are different from each other in phase.

(12) In the constitution (11), the first clock and the second clock have a period in which both clocks have the same voltage level.

(13) In the constitution (11) or (12), out of the n-pieces of basic circuits, as the input signal of the m($2 \leqq m \leqq n$)-row basic circuit, a transfer output of a (m−1)-row basic circuit is inputted, and as a reset signal of the m-row basic circuit, the scanning circuit output of the (m+2)-row basic circuit is inputted.

(14) In the constitution (13), out of the n-pieces of basic circuits, as the input signal of the first-row basic circuit, a start signal is inputted.

(15) In any one of the constitutions (11) to (14), out of the n-pieces of basic circuits, as reset signals for the (n−1)-row basic circuit and the n-row basic circuit, an inverted signal of the start signal is inputted.

(16) In any one of the constitutions (11) to (15), out of the n-pieces of basic circuits, the n-row basic circuit is used as a dummy circuit and does not contribute to a shift operation.

To briefly explain advantageous effects obtained by the typical inventions among inventions disclosed in this specification, they are as follows.

According to the present invention, it is possible to provide the display device provided with the drive circuit having the CMOS shift register which is constituted of a simple CMOS circuit.

DETAILED DESCRIPTION OF THE INVENTION

Hereinafter, embodiments of the present invention are explained in detail in conjunction with drawings.

Here, in all drawings for explaining the embodiments, parts having identical functions are given same symbols and their repeated explanation is omitted.

Figure 1:
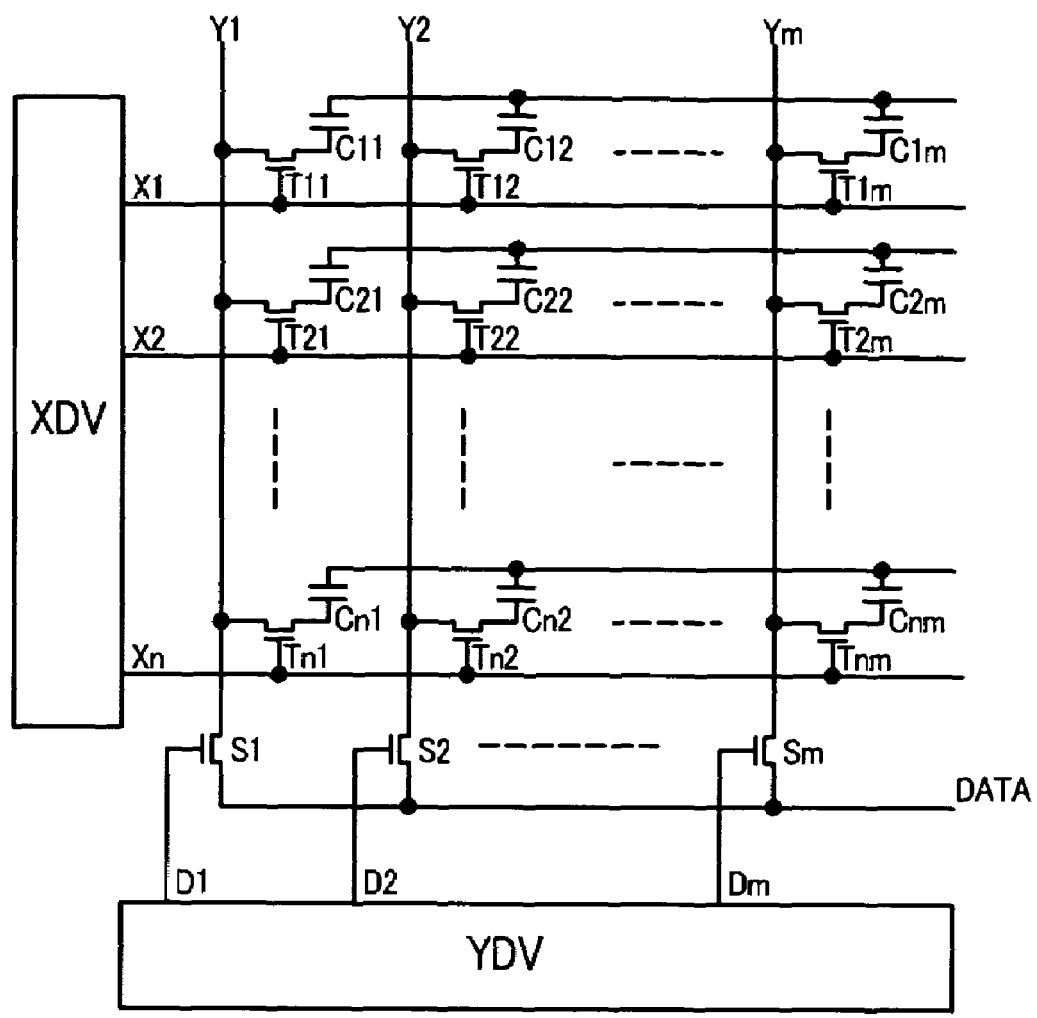
FIG. 1 is a circuit diagram showing an equivalent circuit of an active matrix type liquid crystal display device of an embodiment of the present invention.

FIG. 1 is a circuit diagram showing an equivalent circuit of an active matrix type liquid crystal display device of an embodiment of the present invention.

As shown in FIG. 1, the active matrix type liquid crystal display device of the embodiment includes, on a liquid crystal surface of one of a pair of substrates which are arranged to face each other with a liquid crystal therebetween, n-pieces of scanning lines (X1, X2, . . . Xn) which extend in the x direction and m pieces of video lines (Y1, Y2, . . . Ym) which extend in the y direction.

Regions which are surrounded by the scanning lines (also referred to as gate lines) and the video lines (also referred to as drain lines) constitute pixel regions. Each pixel region is provided with a thin film transistor (Tnm) which has a gate thereof connected to the scanning line, a drain (or a source) thereof connected to the video line, and a source (or a drain) thereof connected to a pixel electrode. Further, a holding capacitance (Cnm) is formed between the pixel electrode and a common electrode (COM).

The respective scanning lines (X1, X2, . . . Xn) are connected to a vertical drive circuit (XDV) and sequentially supply a gate signal toward the scanning lines from X1 to Xn by the vertical drive circuit (XDV) (referred to as "forward direction scanning). Alternatively, the respective scanning lines (X1, X2, . . . Xn) sequentially supply the gate signal toward the scanning lines from Xn to X1 by the vertical drive circuit (XDV) (referred to as "backward direction scanning").

The respective video lines (Y1, Y2, . . . Ym) are connected to drains (or sources) of switching elements (S1, S2, . . . Sm).

The switching elements (S1, S2, . . . Sm) have sources (or drains) thereof connected to video signal lines (DATA) and have gates thereof connected to a horizontal drive circuit (YDV).

By a horizontal drive circuit (YDV), scanning is sequentially performed toward the switching elements from S1 to Sm (referred to as "forward direction scanning). Alternatively, by the horizontal drive circuit (YDV), scanning is sequentially performed toward the switching elements from Sm to S1 (referred to as "reverse direction scanning).

Figure 2:
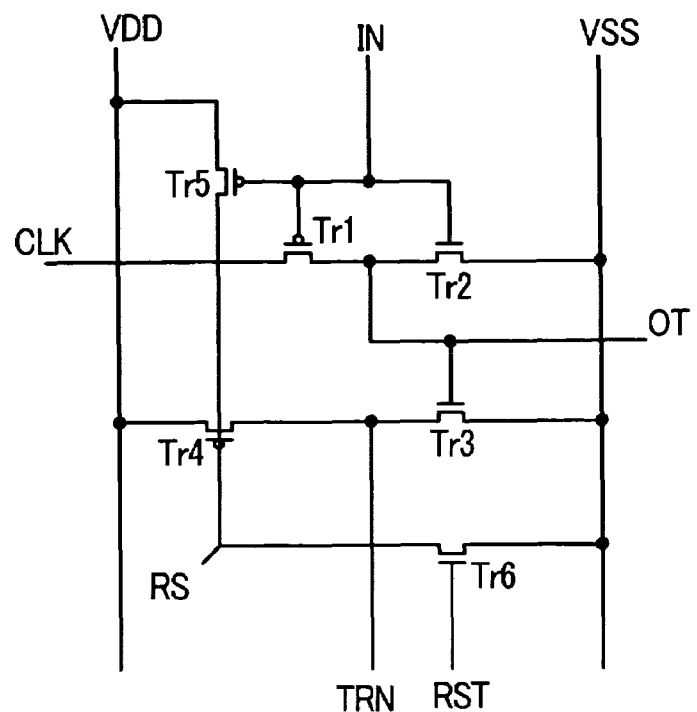
FIG. 2 is a circuit diagram for explaining a basic circuit of a CMOS shift register of the embodiment of the present invention.

FIG. 2 is a circuit diagram for explaining a basic circuit of the CMOS shift register of this embodiment of the present invention, and also is a circuit diagram for explaining a basic circuit of the CMOS shift register which is applied to the vertical drive circuit (XDV) and the horizontal drive circuit (YDV) shown in FIG. 1.

The CMOS shift register of this embodiment adopts a circuit which is constituted of six transistors consisting of p-type MOS transistors (Tr1, Tr4, Tr5) and n-type MOS transistors (Tr2, Tr3, Tr6) as the basic circuit shown in FIG. 2.

These six transistors (Tt1 to Tr6) are formed of a thin film transistor which uses poly-silicon as a material of the semiconductor layer.

Further, the vertical drive circuit (XDV) and the horizontal drive circuit (YDV) in FIG. 1 are circuits arranged in the inside of the liquid crystal display panel. These circuits are, in the same manner as the six transistors (Tt1 to Tr6), formed of a thin film transistor which uses poly-silicon as the semiconductor layer, wherein these thin film transistors are formed simultaneously with the formation of the thin film transistor of the pixels (Tnm).

In FIG. 2, a first power source voltage (VDD) is set as a High level (hereinafter referred to as a H level) and a second power source voltage (VSS) is set as a Low level (hereinafter referred to as an L level).

A drain of the p-type MOS transistor (Tr4) and a drain of the n-type MOS transistor (Tr3) are connected to each other, a source of the p-type MOS transistor (Tr4) is connected to the first power source voltage (VDD), and a source of the n-type MOS transistor (Tr3) is connected to the second power source voltage (VSS).

In the same manner, a drain of the p-type MOS transistor (Tr5) and a drain of the n-type MOS transistor (Tr6) are connected to each other, a source of the p-type MOS transistor (Tr5) is connected to the first power source voltage (VDD), and a source of the n-type MOS transistor (Tr6) is connected to the second power source voltage (VSS).

Further, a drain of the p-type MOS transistor (Tr1) and a drain of the n-type MOS transistor (Tr2) are connected to each other, and a source of the n-type MOS transistor (Tr2) is connected to the second power source voltage (VSS).

A clock (CLK) is applied to a source of the p-type MOS transistor (Tr1), and an input signal (IN) is applied to a gate of the p-type MOS transistor (Tr1) and a gate of the n-type MOS transistor (Tr2). Further, the input signal (IN) is also applied to a gate of the p-type MOS transistor (Tr5).

The drain of the p-type MOS transistor (Tr5) is connected to the gate of the p-type MOS transistor (Tr4), the drain of the p-type MOS transistor (Tr4) is connected to a transfer output terminal, and a transfer output (TRN) is outputted from the transfer output terminal.

The gate of the n-type MOS transistor (Tr3) is connected to the drain of the p-type MOS transistor (Tr1), the drain of the p-type MOS transistor (Tr1) is connected to a scanning circuit output terminal, and a scanning circuit output (OT) is outputted from the scanning circuit output terminal.

A reset signal (RST) is applied to the gate of the n-type MOS transistor (Tr6).

In a steady state, the input signal (IN) assumes the H level and a node (RS) and a reset signal (RST) assume the L level. Here, the scanning circuit output (OT) assumes the L level and the transfer output (TRN) assumes the H level.

Figure 3:
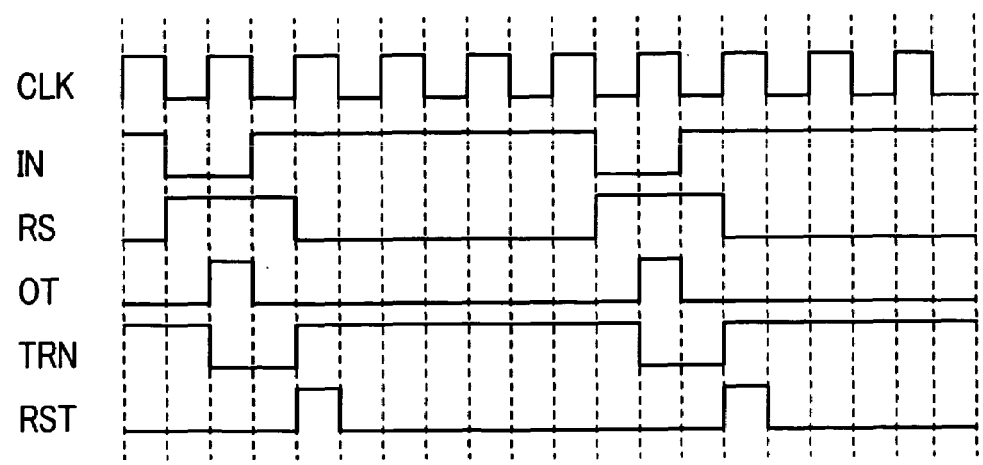
FIG. 3 is a view for explaining timings of a clock (CLK) and an input signal (IN) which are inputted to the basic circuit shown in FIG. 2.

To the basic circuit shown in FIG. 2, the clock (CLK) and the input signal (IN) are inputted at timings shown in FIG. 3.

When the input signal (IN) assumes the L level from the H level, the transistor (Tr1) and the transistor (Tr5) are turned on, and the transistor (Tr2) is turned off.

At this timing, the clock (CLK) assumes the L level and hence, a potential of the scanning circuit output (OT) is held at the L level and is not changed. Further, the transistor (Tr5) is turned on and hence, the node (RS) assumes the H level and the transistor (Tr4) is turned off.

Since the transistor (Tr3) is turned off, the transfer output (TRN) assumes a floating state and is held at the H level.

When the clock (CLK) assumes the H level, since the transistor (Tr1) is turned on, the scanning circuit output (OT) assumes the H level and the transistor (Tr3) is turned on and the transfer output (TRN) assumes the L level.

When the input signal (IN) assumes the H level simultaneously with the changeover of the clock (CLK) to the L level, the transistor (Tr1) is turned off and the transistor (Tr2) is turned on.

Accordingly, the scanning circuit output (OT) assumes the L level, the transistor (Tr3) is turned off, and the transfer output (TRN) is held at the L level.

Since the transistor (Tr5) is turned off when the input signal (IN) assumes the H level, the node (RS) assumes a floating state and is held at the H level.

When the reset signal (RST) assumes the H level from the L level, the transistor (Tr6) is turned on and the node (RS)

assumes the L level. Accordingly, the transfer output (TRN) assumes the H level and hence, the transfer output (TRN) obtains a steady state.

As described above, by transferring the input signal (IN) by shifting the input signal (IN) by one clock as the transfer output (TRN), it is possible to latch and output the clock (CLK) at the timing of the input signal (IN).

Figure 4:
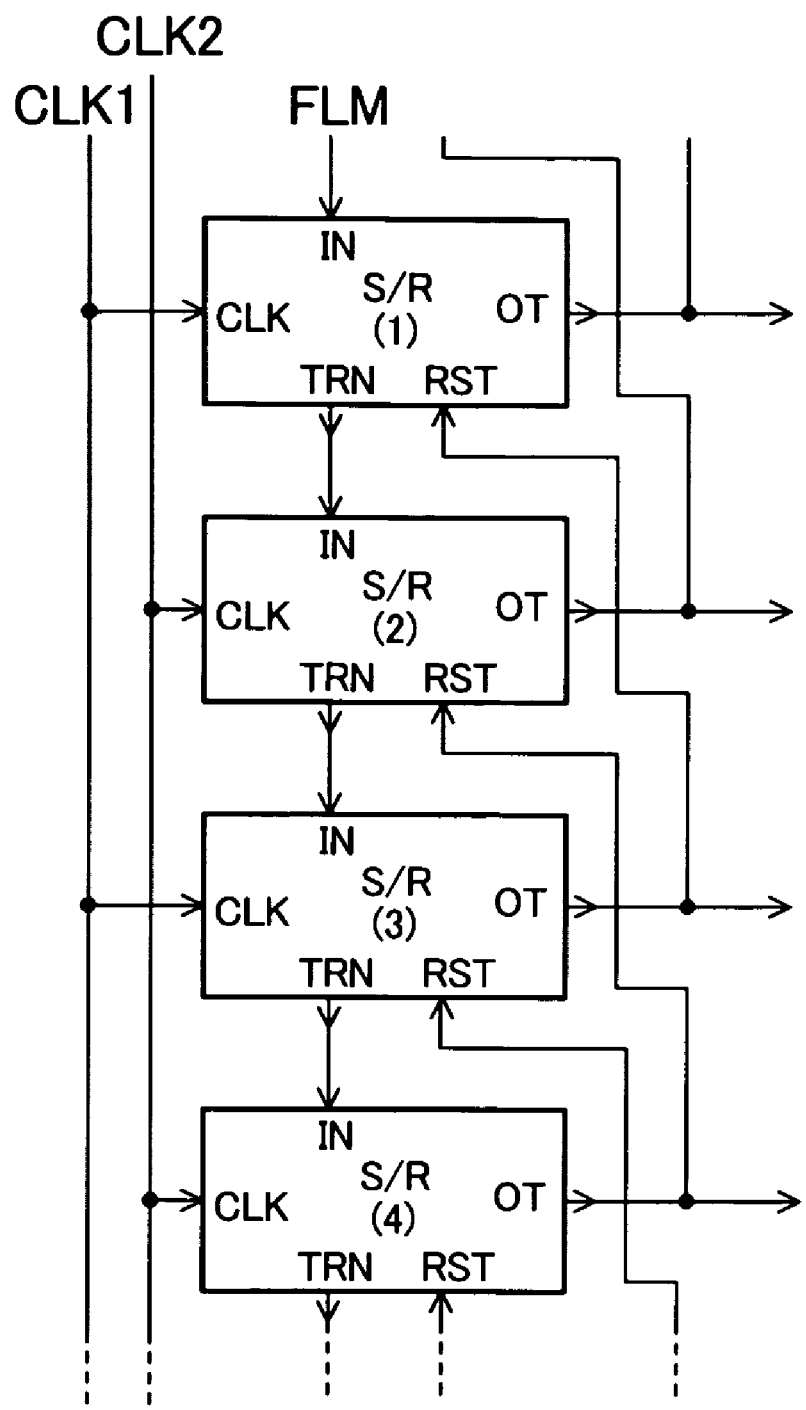
FIG. 4 is a view showing the CMOS shift register of the embodiment of the present invention.
Figure 5:
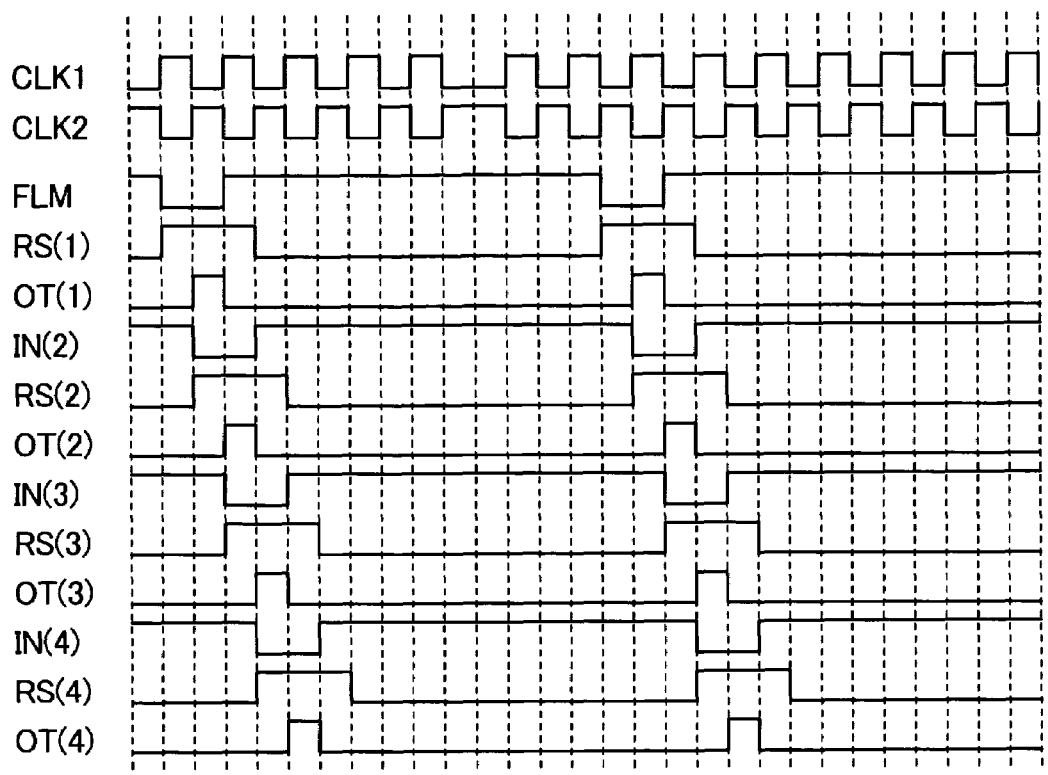
FIG. 5 is a view showing one example of a timing chart of the CMOS shift register shown in FIG. 4.

As shown in FIG. 4, by connecting the n-pieces of the above-mentioned basic circuits (S/R) in multiple rows and by inputting clocks having phases opposite to each other to CLK terminals of the odd-numbered basic circuits (S/R) and CLK terminals of the even-numbered basic circuits (S/R), the clock is sequentially transferred thus allowing the constitution to have a function of the shift register. One example of a timing chart of the CMOS shift register shown in FIG. 4 is shown in FIG. 5.

Figure 15:
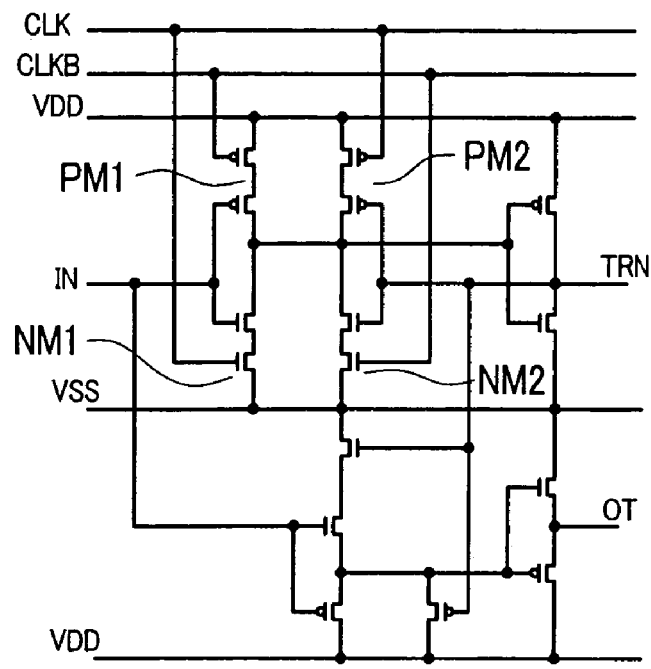
FIG. 15 is a circuit diagram showing the actual circuit constitution of a unit circuit shown in FIG. 14.

In case of the circuit constitution shown in FIG. 15, the p-type MOS transistors (PM1, PM2) and the n-type MOS transistors (NM1, NM2) have gates thereof directly connected to a clock bus through which the clock (CLK) and the inverted clock (CLKB) are transmitted.

That is, in case of the circuit constitution shown in FIG. 15, compared to the case shown in FIG. 2 in which the drain (or the source) of the transistor (Tr1) is connected to the clock bus through which the clock (CLK) is transmitted, a load of the clock bus is increased by an amount corresponding to a gate capacitance.

In general, to drive the lines of higher load in a stable manner, it is necessary to increase a steady-state current and hence, the power consumption is increased. However, by adopting the constitution of the basic circuit of this embodiment, the load of the clock bus can be reduced and hence, it is possible to realize the reduction of power consumption attributed to charging and discharging of the clock bus and the reduction of power consumption attributed to the reduction of the load of the circuit which drives the clock bus.

Further, as in the case of the circuit constitution shown in FIG. 15, the p-type MOS transistors (PM1, PM2) and the n-type MOS transistors (NM1, NM2) perform the switching operation at a cycle of the clock (CLK).

The cycle of the clock (CLK) is several times as large as an operation cycle of the CMOS shift register and hence, it is possible to perform the operation several times during a period in which other transistor performs one operation.

In the basic circuit of this embodiment, all transistors are operated at an operation cycle of the CMOS shift register and hence, it is possible to enhance the reliability compared to the circuit constitution shown in FIG. 15.

In the circuit constitution shown in FIG. 15, transistors in series connection exist in the transfer part, the NAND circuit (NAND) and the like. When the transistors are connected in series, usually, the ON resistance is increased compared to the single transistor and hence, the driving power is reduced.

In the basic circuit of this embodiment, no NAND circuit is necessary and the transistors which are connected in series are not present, it is possible to realize the high-speed operation (resulting in the lowering of voltage).

In general, a penetration current flows at the time of transition state in which a potential is changed over as in the case of the inverter or the like. This brings about the increase of power consumption.

In the basic circuit of this embodiment, in a transitional state in which the voltage of the input signal (IN) is changed over, when the clock (CLK) is at the H level, it is expected that the penetration current flows toward the second power source voltage (VSS) from the clock bus through which the clock (CLK) is transmitted by way of the transistor (Tr1) and the transistor (Tr2). However, the penetration current hardly flows due to a reason described below.

As shown in FIG. 4, the IN terminal is connected to the TRN terminal at a preceding row, while the RST terminal is connected to next-to-next OT terminal. That is, the input signal (IN) is the transferred signal (TRN) of the preceding row, while the reset signal (RST) is the next-to-next scanning circuit output (OT).

In general, the transistor generates an operational delay and hence, timing that the input signal (IN) is changed over is delayed with respect to the clock (CLK).

Accordingly, the input signal (IN) assumes the L level from the H level after the clock (CLK) is changed over from the H level to the L level, while the input signal (IN) assumes the H level from the L level after the clock (CLK) is changed over from the L level to the H level.

In this manner, the basic circuit of this embodiment is a kind of dynamic circuit and hence, the penetration current hardly flows whereby the basic circuit is advantageous for the reduction of power consumption.

With respect to an output of the basic circuit of this embodiment, since the changeovers of the outputs are performed at the same timing and hence, there may be case that that the changeovers of the outputs intersect each other due to the delay.

Usually, to prevent the gate signal from turning on two lines simultaneously, a period of L level is provided at the changeover timing.

Figure 6:
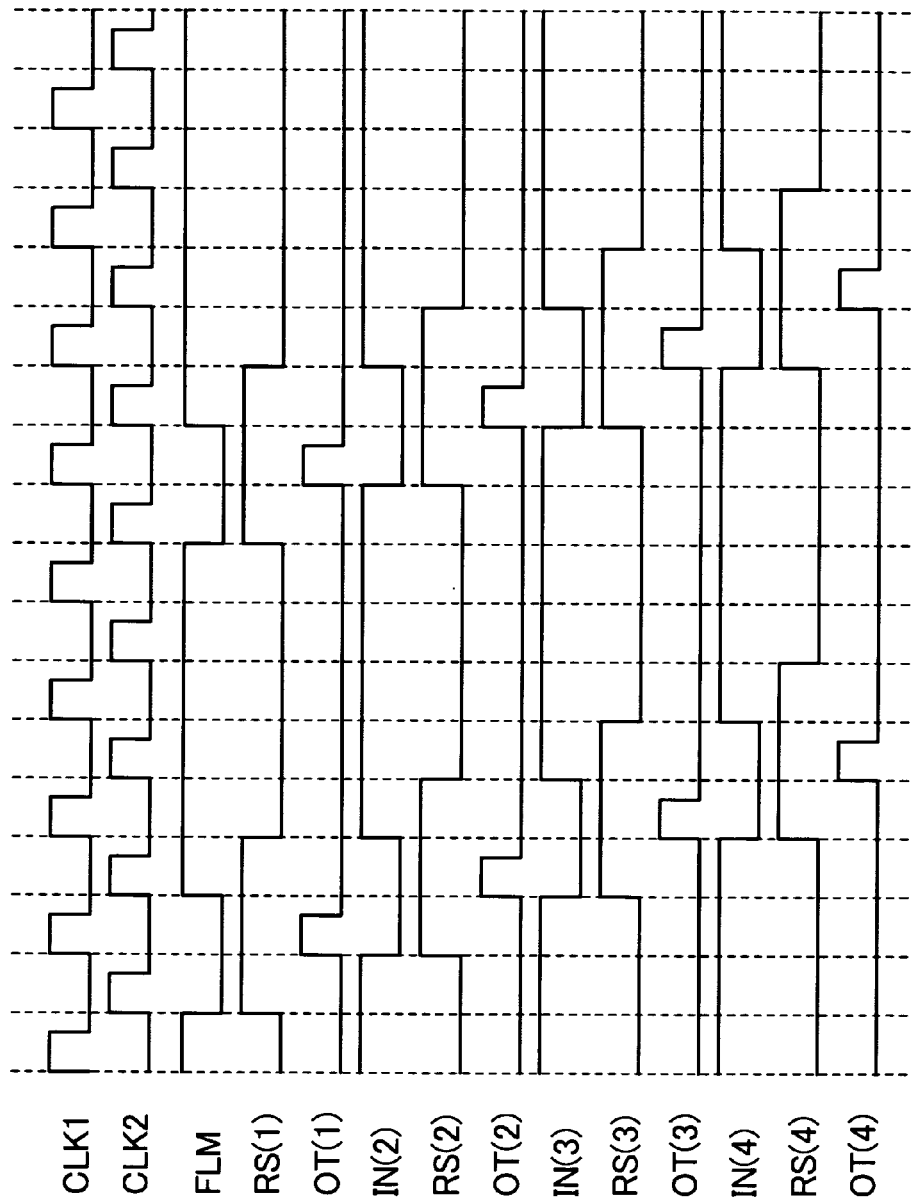
FIG. 6 is a view showing another example of the timing chart of the CMOS shift register shown in FIG. 4.

The circuit constitution shown in FIG. 15 adopts means in which the NAND circuit has three inputs and a signal which makes the period of L level is inputted to the NAND circuit (NAND). In this embodiment, as shown in FIG. 6, by providing the period of L level to both of the clock (CLK1) and the clock (CLK2), it is possible to provide the period of L level at the output changeover timings. It is needless to say that this embodiment adopts the NAND circuit (NAND) or the like.

As shown in FIG. 4, to the RST terminal, the scanning circuit output (OT) of the next-to-next row is inputted. Accordingly, in the basic circuits of last two rows of the CMOS shift register, the signal which is inputted to the RST terminal is not present. That is, since the node (RS) does not assume the L level, the transferred output (TRN) is held at the L level.

In the basic circuit of the final row, the circuit which is connected to the TRN terminal is not present and hence, there arises no problem. However, the transferred output (TRN) which is outputted from the TRN terminal of the basic circuit of the row which precedes the final basic circuit by one row, that is, the input signal (IN) of the final row continues to acquire the clock (CLK) while being held at the L level. Accordingly, it is necessary to make use of the basic circuit of the final row as a dummy row.

By inputting an inverted signal (FLMB) of the start signal (FLM) to the RST terminals of the basic circuits of final two rows, it is possible to allow the node (RS) to assume the L level at the time of inputting thus acquiring a steady state.

Further, a waveform of the clock (CLK) is continuously outputted form the OT terminal of the basic circuit of the final row and hence, the signal of the H level and the L level is continuously inputted to the RST terminal of the basic circuit of the row which precedes the final row by two rows. However, the node (RS) assumes the L level in a steady state and hence, there arises no problem.

In a steady state, the node (RS) is in a floating state and holds the L level. However, when a leak current such as an OFF current of the transistor or the like is present, the node (RS) cannot hold the L level.

As a main leak path of the node (RS), a path to a first power source voltage (VDD) through the transistor (Tr5) is considered, and when a potential of the node (RS) is elevated than the L level, there exists a possibility that an erroneous operation occurs.

Figure 7:
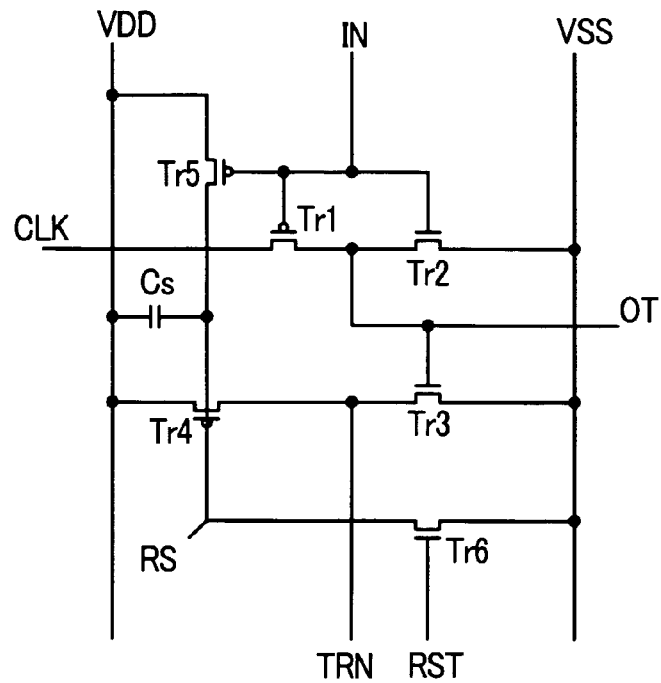
FIG. 7 is a circuit diagram showing a modification of the basic circuit shown in FIG. 2.

Accordingly, for example, as shown in FIG. 7, by adding a holding capacitance (Cs) between the node (RS) and the first power source voltage (VDD), it is possible to stabilize the operation.

It is needless to say that the holding capacitance (Cs) may be connected to a second power source voltage (VSS) or other stable potential.

Further, it is needless to say that to reduce the leaking current of the transistor (Tr5) which constitutes the main leak path, the increase of a channel length of the transistor (Tr5), the decrease of a channel width of the transistor (Tr5) and the like are also effectively adopted.

The IN terminal (in other words, TRN terminal in the basic circuit of the preceding row) assumes a floating state at the timing that the scanning circuit output (OT) of H level is outputted, that is, at the timing that the input signal (IN) is at the L level and the clock (CLK) is at the H level.

Accordingly, when the clock (CLK) assumes the H level from the L level, it is expected that a potential of the IN terminal is elevated than the L level due to capacitive coupling through a gate capacitance of the transistor (Tr1).

In this case, the ON resistance of the transistor (Tr1) is elevated, and the delay of output to the scanning circuit output (OT) is increased. Further, when the elevated potential exceeds a threshold value of the transistor (Tr2), the transistor (Tr2) is turned on and, during a period in which the scanning circuit output (OT) is outputted, a penetration current flows toward the second power source voltage (VSS) from the clock bus through which the clock (CLK) is transmitted via the transistor (Tr2) and the transistor (Tr1).

Figure 8:
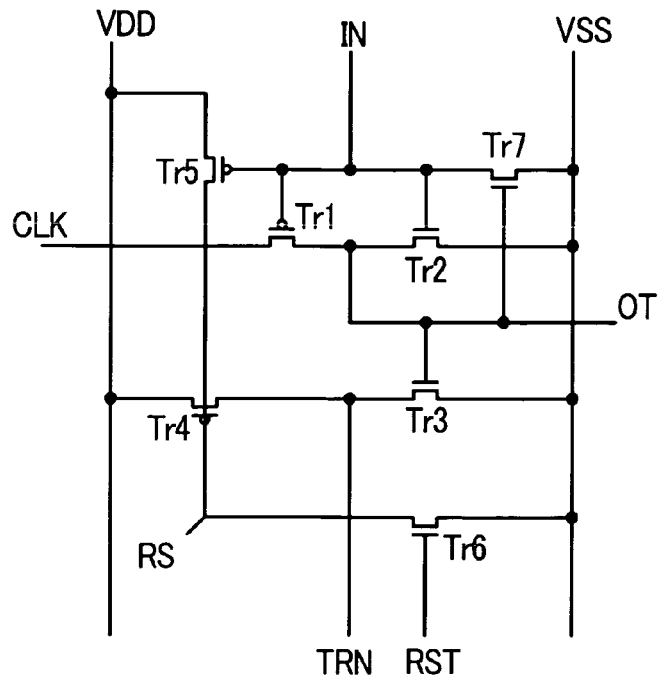
FIG. 8 is a circuit diagram showing a modification of the basic circuit shown in FIG. 2.

Accordingly, as shown in FIG. 8, an n-type MOS transistor (Tr7) is connected between the gate of the transistor (Tr2) and the second power source voltage (VSS), and the scanning circuit output (OT) is applied to the gate of the transistor (Tr7).

Accordingly, it is possible to set the IN terminal at the L level during the period in which the scanning circuit output (OT) is at the H level.

When the transistor (Tr7) is added, it is expected that a penetration current flows in the transistor (Tr7) at a moment that the input signal (IN) is changed over from the L level to the H level or at a moment that the scanning circuit output (OT) is changed over from the H level to the L level.

However, the changeover timing of the input signal (IN) is delayed with respect to the changeover timing of the scanning circuit output (OT) and hence, it is expected that the penetration current hardly flows.

That is, when the scanning lines are connected to the scanning circuit, a load capacitance of the scanning circuit output (OT) is increased.

As a matter of course, the delays in rising and falling of the gate potential of the transistor (Tr3) are also increased and hence, the transfer delay is increased. Accordingly, it is considered that an operational frequency of the circuit is lowered.

The increase of the channel width of the transistor (Tr1) for preventing this phenomenon also increases of influence of the capacitive coupling and hence, the increase of the channel width of the transistor (Tr1) is not desirable.

Figure 9:
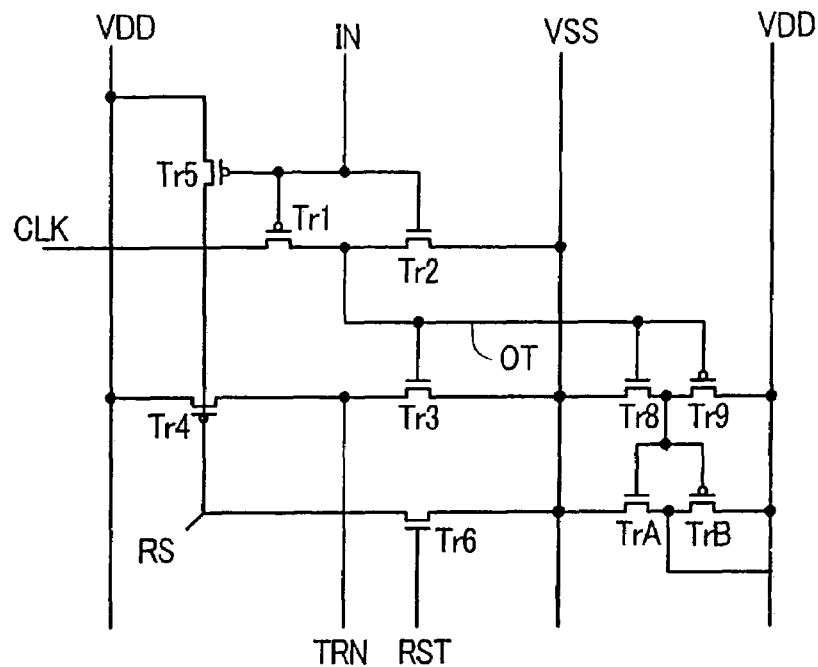
FIG. 9 is a circuit diagram showing a modification of the basic circuit shown in FIG. 2.

As the countermeasure in general, as shown in FIG. 9, it is desirable to adopt a method which can lower the load of the scanning circuit output (OT) by providing a buffer circuit using an inverter which is constituted of a p-type MOS transistor (Tr9), an n-type MOS transistor (Tr8), a p-type MOS transistor (TrB), and an n-type MOS transistor (TrA).

Although the node (RS) is in a floating state and is held at the L state in a steady state, the node (RS) is unstable in an initial state (at the time of supplying a power source).

Figure 10:
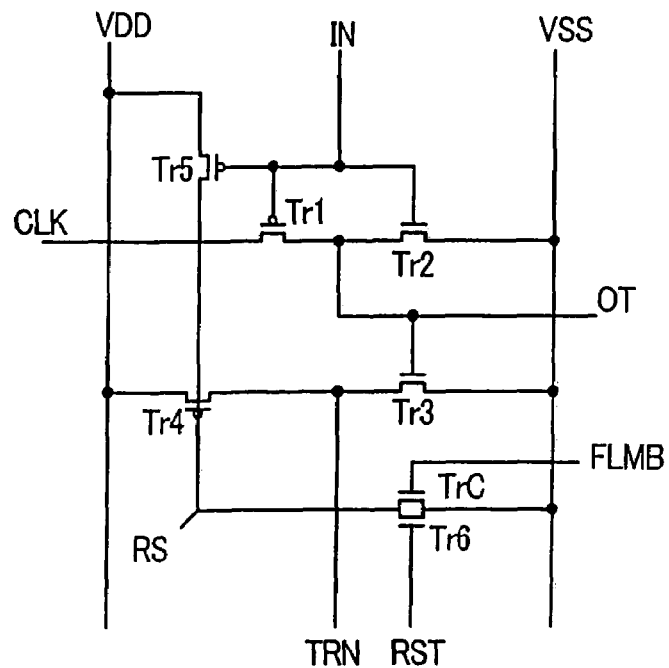
FIG. 10 is a circuit diagram showing a modification of the basic circuit shown in FIG. 2.

Accordingly, as shown in FIG. 10, by providing an n-type MOS transistor (TrC) in parallel to the transistor (Tr6) and by applying an inverted signal (FLMB) of the start signal (FLM) to a gate of the transistor (TrC), it is possible to reset the node (RS) into a steady state when the start signal (FLM) is inputted.

At the timing that the input signal (IN) assumes the H level from the L level and the clock (CLK) assumes the L level from the H level, as mentioned previously, the timing of the input signal (IN) is delayed attributed to the delay.

Accordingly, the timing that the L level is written in the scanning circuit output (OT) via the transistor (Tr2) is delayed and, when the changeover is started, the L level is written in the scanning circuit output (OT) via the transistor (Tr1). That is, the L level is written in the source (or the drain) of the transistor (Tr1) when the gate of the transistor (Tr1) is at the L level and the drain (or the source) of the transistor (Tr1) is at the L level.

In this case, it is impossible to obtain the high gate/source (or drain) voltage and hence, it is considered that the delay in writing to the scanning circuit output (OT) is increased.

In general, it is preferable to write the L level to the n-channel transistor than the p-channel transistor.

Figure 11:
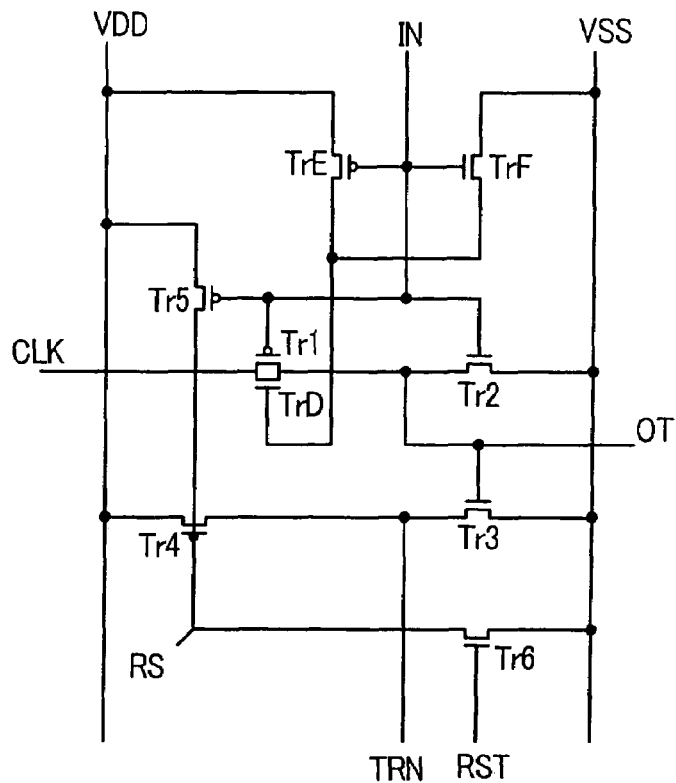
FIG. 11 is a circuit diagram showing a modification of the basic circuit shown in FIG. 2.
Figure 12:
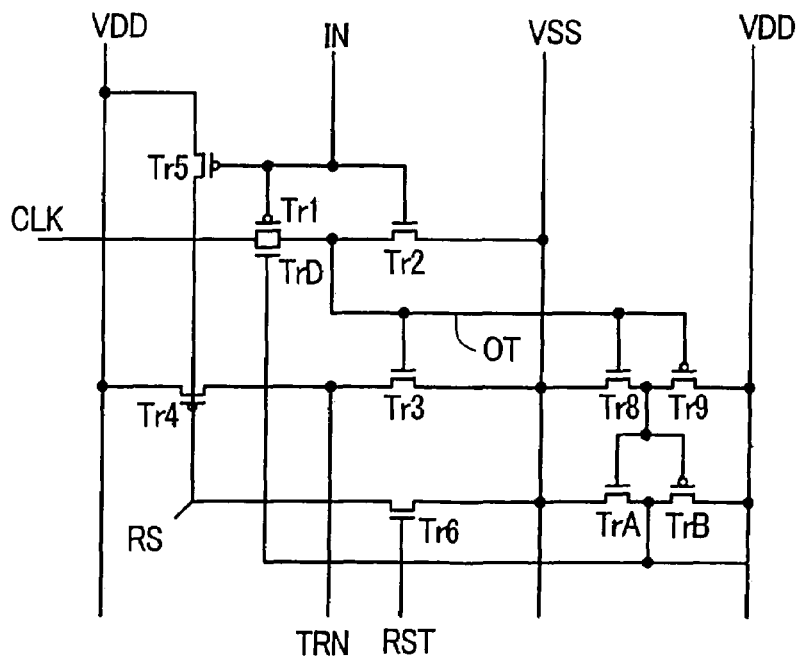
FIG. 12 is a circuit diagram showing a modification of the basic circuit shown in FIG. 2.

Accordingly, as shown in FIG. 11, by connecting an n-type MOS transistor (TrD) to the transistor (Tr1) in parallel, and by applying an input signal which is inverted by an inverter which is constituted of a p-type MOS transistor (TrE) and an n-type MOS transistor (TrF) to a gate of the transistor (TrD) thus enabling CMOS switching, it is possible to reduce the writing delay. Here, as shown in FIG. 12, by combining the transistor (TrD) in FIG. 11, the p-type MOS transistor (Tr9) and the n-type MOS transistor (Tr8) in FIG. 9, and the inverter which is constituted of the p-type MOS transistor (TrB) and the n-type MOS transistor (TrA), it is possible to eliminate the inverter which is constituted of the p-type MOS transistor (TrE) and the n-type MOS transistor (TrF) in FIG. 11.

Figure 13:
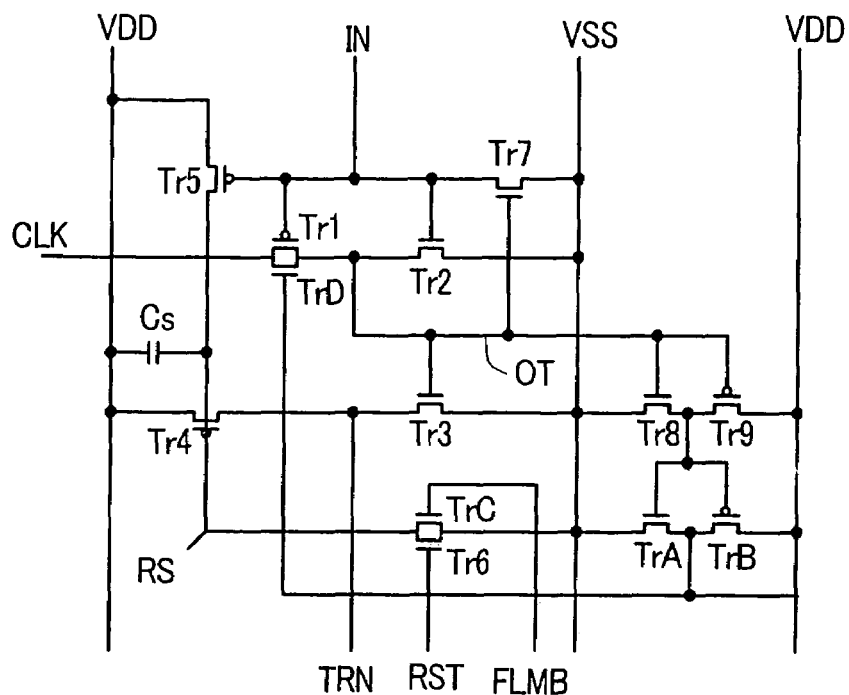
FIG. 13 is a circuit diagram showing a basic circuit which incorporates all modifications shown in FIG. 7 to FIG. 12.
Figure 14:
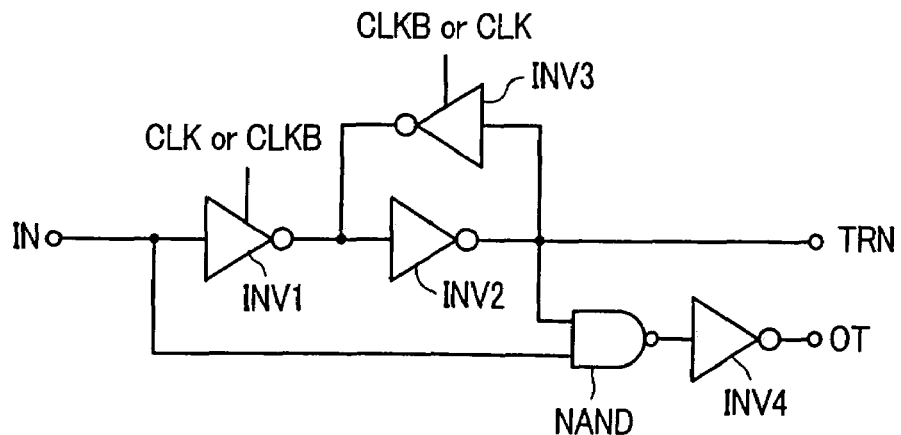
FIG. 14 is a circuit diagram showing a unit circuit of a conventional CMOS shift register.

In this case, even after the scanning circuit output (OT) assumes the L level, it is possible to turn on the transistor (TrD) during a period which is delayed by the inverters in two rows. Since there arises no problem unless the operation is delayed by one clock, even when the circuit is connected to an output which has a large load and a large delay, there arises no problem. FIG. 13 shows a circuit which includes all of the above-mentioned functions.

Here, by converting all of the n-type MOS transistors into p-type MOS transistors and all of the p-type MOS transistors into n-type MOS transistors, by exchanging the first power source voltage (VDD) and the second power source voltage (VSS) and by exchanging logics of the input signals, it is possible to provide a CMOS shift register which is operated based on an inverted logic. Further, in the above-mentioned explanation, the explanation has been made with respect to the case in which the MOS (Metal Oxide Semiconductor)-type TFT is used as the transistor. However, the present invention can also use a MIS (Metal Insulator Semiconductor)-type TFT or the like. Further, in the above-mentioned explanation, the explanation has been made with respect to the case in which the vertical drive circuit (XDV) and the horizontal drive circuit (YDV) are incorporated into the display panel (are integrally formed on a substrate of the display panel). However, the present invention is not limited to such formation, and the vertical drive circuit (XDV) per se, the horizontal drive circuit (YDV) per se, or the a partial function of the circuit may be constituted by using a semiconductor chip.

Further, the above-mentioned explanation has been made with respect to the case in which the present invention is applied to the liquid crystal display device. However, it is needless to say that the present invention is not limited to the liquid crystal display device and is also applicable to an EL display device which uses an organic EL element, for example.

Although the invention made by inventors of the present invention has been specifically explained in conjunction with the above-mentioned embodiments, it is needless to say that the present invention is not limited to the above-mentioned embodiments and various modification are conceivable without departing from the gist of the present invention.

What is claimed is:

1. A display device comprising:
    a plurality of pixels; and
    a drive circuit which drives the plurality of pixels, wherein the drive circuit includes a shift register,
    the shift register includes n(n≧2) pieces of basic circuits which are connected vertically in multiple rows,
    the basic circuit includes:
    a first transistor of a first conductive type having a first electrode to which a clock is applied;
    a second transistor of a second conductive type different from the first transistor of the first conductive type in a conductive type and has a second electrode thereof connected to a second electrode of the first transistor and has a second power source voltage applied to a first electrode thereof,
    a third transistor of the first conductive type in which a first power source voltage different from the second power source voltage source is applied to the first electrode;
    a fourth transistor of the second conductive type which has a second electrode thereof connected to a second electrode of the third transistor, a control electrode thereof connected to the second electrode of the first transistor, and the second power source voltage applied to a first electrode thereof;
    a fifth transistor of the first conductive type which has the first power source voltage applied to a first electrode thereof and has a second electrode thereof connected to a control electrode of the third transistor; and
    a sixth transistor of the second conductive type which has a second electrode thereof connected to the second electrode of the fifth transistor and has the second power source voltage applied to a first electrode thereof;
    wherein:
    an input signal is applied to a control electrode of the first transistor, a control electrode of the second transistor, a control electrode of the fifth transistor,
    the second electrode of the first transistor is connected to a scanning circuit output terminal,
    a reset signal is applied to a control electrode of the sixth transistor, and
    a second electrode of the third transistor is connected to a transfer output terminal.

2. A display device according to claim 1, wherein the basic circuit has a capacitive element which has one end which is connected to the second electrode of the fifth transistor and another end to which a predetermined voltage is applied.

3. A display device according to claim 2, wherein the predetermined voltage is the first power source voltage or the second power source voltage.

4. A display device according to claim 1, wherein the basic circuit includes a buffer circuit which is provided between the second electrode of the first transistor and the scanning circuit output terminal.

5. A display device according to claim 4, wherein the buffer circuit is constituted of an inverter.

6. A display device according to claim 4, wherein the basic circuit has a transistor, TrD, of the second conductive type which is connected to the first transistor in parallel, wherein a control electrode of the transistor, TrD, is connected to an output terminal of the buffer circuit.

7. A display device according to claim 1, wherein a first clock is supplied to the first electrodes of the first transistors of odd-numbered-row basic circuits out of the n-pieces of basic circuits,
    a second clock is supplied to the first electrodes of the first transistors of even-numbered-row basic circuits out of the n-pieces of basic circuits, and
    the first clock and the second clock are equal in cycle and are different from each other in phase.

8. A display device according to claim 7, wherein the first clock and the second clock have a period in which both clocks have the same voltage level.

9. A display device according to claim 8, wherein out of the n-pieces of basic circuits, as the input signal of the m(2≦m≦n)-row basic circuit, a transfer output of a (m−1)-row basic circuit is inputted, and
    as a reset signal of the m-row basic circuit, the scanning circuit output of the (m+2)-row basic circuit is inputted.

10. A display device according to claim 7, wherein out of the n-pieces of basic circuits, as the input signal of the m(2≦m≦n)-row basic circuit, a transfer output of a (m−1)-row basic circuit is inputted, and
    as a reset signal of the m-row basic circuit, the scanning circuit output of the (m+2)-row basic circuit is inputted.

11. A display device according to claim 10, wherein out of the n-pieces of basic circuits, as the input signal of the first-row basic circuit, a start signal is inputted.

12. A display device according to claim 7, wherein out of the n-pieces of basic circuits, as reset signals for the (n−1)-row basic circuit and the n-row basic circuit, an inverted signal of the start signal is inputted.

13. A display device according to claim 7, wherein out of the n-pieces of basic circuits, the n-row basic circuit is used as a basic circuit of a dummy row and does not contribute to a shift operation.

14. A display device according to claim 1, wherein the basic circuit includes a seventh transistor of the second conductive type which has a second electrode thereof connected to the control electrode of the second transistor, a control electrode thereof connected to the second electrode of the first transistor, and the second power source voltage applied to a first electrode thereof.

15. A display device according to claim 1, wherein the basic circuit includes a transistor, TrC, of the second conductive type which is connected to the sixth transistor in parallel, wherein an inverted signal of a start signal is applied to a control electrode of the transistor, TrC.

16. A display device according to claim 1, wherein the basic circuit includes a transistor, TrD, of the second conductive type which is connected to the first transistor in parallel, and an inverted signal of an input signal is applied to a control electrode of the transistor, TrD.

* * * * *

UNITED STATES PATENT AND TRADEMARK OFFICE
CERTIFICATE OF CORRECTION

| | |
|---|---|
| PATENT NO. | : 7,652,653 B2 |
| APPLICATION NO. | : 11/522932 |
| DATED | : January 26, 2010 |
| INVENTOR(S) | : Nakao et al. |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 656 days.

Signed and Sealed this

Twenty-third Day of November, 2010

David J. Kappos
*Director of the United States Patent and Trademark Office*